United States Patent
Wang et al.

(10) Patent No.: US 7,820,501 B2
(45) Date of Patent: Oct. 26, 2010

(54) DECODER FOR A STATIONARY SWITCH MACHINE

(75) Inventors: Yun-Yu Wang, Poughquag, NY (US); Christopher D. Sheraw, Poughkeepsie, NY (US); Anthony G. Domenicucci, New Paltz, NY (US); Linda Black, Wappingers Falls, NY (US); Judson R. Holt, Wappingers Falls, NY (US); David M. Fried, Brewster, NY (US)

(73) Assignees: International Business Machines Corporation, Armonk, NY (US); GlobalFoundries, Inc, Grand Cayman (KY)

( * ) Notice: Subject to any disclaimer, the term of this patent is extended or adjusted under 35 U.S.C. 154(b) by 1010 days.

(21) Appl. No.: 11/548,428

(22) Filed: Oct. 11, 2006

(65) Prior Publication Data

US 2008/0087961 A1 Apr. 17, 2008

(51) Int. Cl.
*H01L 21/336* (2006.01)
(52) U.S. Cl. .................. 438/199; 438/478; 438/489; 257/E21.12; 257/E21.561; 117/43
(58) Field of Classification Search .......... 438/199, 438/478, 489; 257/E21.12, E27.112, E21.32, 257/E21.561; 117/43
See application file for complete search history.

(56) References Cited

U.S. PATENT DOCUMENTS

| | | | |
|---|---|---|---|
| 6,107,125 A * | 8/2000 | Jaso et al. ............... 438/149 |
| 6,815,278 B1 | 11/2004 | Ieong et al. |
| 6,825,534 B2 | 11/2004 | Chen et al. |
| 6,830,962 B1 | 12/2004 | Guarini et al. |
| 6,864,534 B2 | 3/2005 | Ipposhi et al. |
| 6,870,226 B2 | 3/2005 | Maeda et al. |
| 7,060,585 B1 | 6/2006 | Cohen et al. |
| 2003/0104658 A1 * | 6/2003 | Furukawa et al. .......... 438/151 |
| 2004/0152276 A1 | 8/2004 | Nishimura |
| 2004/0195646 A1 | 10/2004 | Yeo et al. |
| 2004/0256700 A1 | 12/2004 | Doris et al. |
| 2004/0266128 A1 | 12/2004 | Chen et al. |

(Continued)

FOREIGN PATENT DOCUMENTS

JP 2106034 A 4/1990

(Continued)

OTHER PUBLICATIONS

B. Doris, et al. "Simplified Hybrid Orientation Transistor (SHOT) for High Performance CMOS", 2004 Symposium on VLSI Technology Digest of Technical Papers, pp. 86-87.

(Continued)

*Primary Examiner*—Brook Kebede
(74) *Attorney, Agent, or Firm*—Ian D. MacKinnon (57) ABSTRACT

Accordingly, in one embodiment of the invention, a method is provided for reducing stacking faults in an epitaxial semiconductor layer. In accordance with such method, a substrate is provided which includes a first single-crystal semiconductor region including a first semiconductor material, the first semiconductor region having a <110> crystal orientation. An epitaxial layer including the first semiconductor material is grown on the first semiconductor region, the epitaxial layer having the <110> crystal orientation. The substrate is then annealed with the epitaxial layer at a temperature greater than 1100 degrees Celsius in an ambient including hydrogen, whereby the step of annealing reduces stacking faults in the epitaxial layer.

11 Claims, 10 Drawing Sheets

U.S. PATENT DOCUMENTS

2005/0116290 A1    6/2005  de Souza et al.
2006/0024931 A1    2/2006  Chan et al.
2006/0105536 A1*   5/2006  Cheng et al. ............... 438/386
2006/0154429 A1    7/2006  de Souza et al.
2006/0284251 A1*  12/2006  Hsu et al. .................. 257/347

FOREIGN PATENT DOCUMENTS

JP            11017001 A    4/1999

OTHER PUBLICATIONS

M. Yang, et al., "On the Integration of CMOS with Hybrid Crystal Orientations", 2004 Symposium on VLSI Technology Digest of Technical Papers, pp. 160-161.

M. Yang, et al., "High Performance CMOS Fabricated on Hybrid Substrate With Different Crystal Orientations", 2003 IEDM pp. 03-0453 through 03-0456.

* cited by examiner

DECODER FOR A STATIONARY SWITCH MACHINE

BACKGROUND OF THE INVENTION

The present invention relates to semiconductor processing and structures, and more particularly to a method of reducing stacking faults in an epitaxial semiconductor layer overlying another semiconductor region.

Increased operational speed and performance is a continual goal in the design of integrated circuits including complementary metal oxide semiconductor ("CMOS") circuits. CMOS circuits include both n-type field effect transistors ("NFETs") and p-type field effect transistors ("PFETs"). Because of the different ways in which NFETs and PFETs operate, performance is most improved in CMOS circuits when conditions under which NFETs and PFETs operate are tailored to the unique characteristics of each type of transistor.

Hybrid orientation technology ("HOT") refers to a way of manufacturing CMOS circuits in which the NFET has a longitudinal direction (direction of the length of the channel region; i.e., source to drain) aligned with one crystal orientation of a semiconductor substrate and the PFET has a longitudinal direction aligned with a different crystal orientation of the substrate. Higher on-current and faster switching can be achieved in an NFET when the longitudinal direction is oriented in accordance with the <100> crystal orientation, due to the greater mobility of electrons in that crystal orientation. In addition, higher on-current and faster switching can be achieved in a PFET for which the longitudinal direction is oriented in accordance with the <110> crystal orientation, due to the greater mobility of holes in that crystal orientation. Unfortunately, the longitudinal directions of the NFET and the PFET cannot be aligned with these different crystal orientations simply by orienting the NFET and the PFET in the semiconductor substrate in different horizontal directions parallel to the top surface i.e., the major surface of the semiconductor substrate. The <100> crystal orientation is oriented at an angle with respect to a plane in which the <110> crystal orientation runs. Therefore, transistors having these different crystal orientations can only be achieved by fabricating a substrate to include different regions which have these different crystal orientations and fabricating the NFET and the PFET in the different regions.

In the fabrication of some types of transistors, an epitaxial layer is grown over an existing single crystal semiconductor region. Difficulties exist in growing an epitaxial region such that it has a proper and unbroken crystal structure throughout. Stacking faults can occur in the epitaxial layer, typically close to underlying semiconductor region. Typically, stacking faults are locations where a plane of the semiconductor crystal is either inserted as an additional plane where it does not belong, or a plane of the crystal structure is missing. In a particular example, a normal crystal structure of silicon includes a periodically occurring sequence of different types of crystal planes such as ABCABCABC, etc. One type of stacking fault, referred to as an "intrinsic" stacking fault, occurs in a structure such as ABCAB//ABC, in which the crystal plane "C" is missing between the second "B" type crystal plane and the next "A" type crystal plane. Another type of stacking fault, known as an "extrinsic" stacking fault, occurs when an extra crystal plane occurs in the crystal structure in an out of sequence order. For example, an extrinsic stacking fault occurs in a sequence of crystal planes such as ABCA/C/BCABC where the additional crystal plane "C" appears between the crystal planes "A" and "B" which is the normal order.

Various approaches have been tried to reduce stacking faults. Annealing at temperatures, e.g., 950 degrees Celsius, which are normally used to heal epitaxial semiconductor layers and to distribute and settle dopants has proven unsuccessful in removing stacking faults. Prior to the present invention, annealing processes known heretofore have not succeeded in removing stacking faults in epitaxial semiconductor layers.

SUMMARY OF THE INVENTION

Accordingly, in one embodiment of the invention, a method is provided for reducing stacking faults in an epitaxial semiconductor layer. In accordance with such method, a substrate is provided which includes a first single-crystal semiconductor region including a first semiconductor material, the first semiconductor region having a <110> crystal orientation. An epitaxial layer including the first semiconductor material is grown on the first semiconductor region, the epitaxial layer having the <110> crystal orientation. The substrate is then annealed with the epitaxial layer at a temperature greater than 1100 degrees Celsius in an ambient including hydrogen, whereby the step of annealing reduces stacking faults in the epitaxial layer.

DETAILED DESCRIPTION

Accordingly, with reference to FIGS. 1 through 19, a method according to an embodiment of the invention will now be described for fabricating a substrate having an SOI layer and an epitaxial layer at a major surface of the substrate in which the SOI layer and the epitaxial layer have different crystal orientations. Through use of bonded semiconductor-on-insulator ("SOI") and epitaxial growth techniques, it is possible to provide semiconductor regions at the major surface of a substrate which have different crystal orientations. In this way, a bonded SOI substrate can include a p-type bulk semiconductor region having one crystal orientation and an n-type SOI layer having a different crystal orientation.

Figure 1:
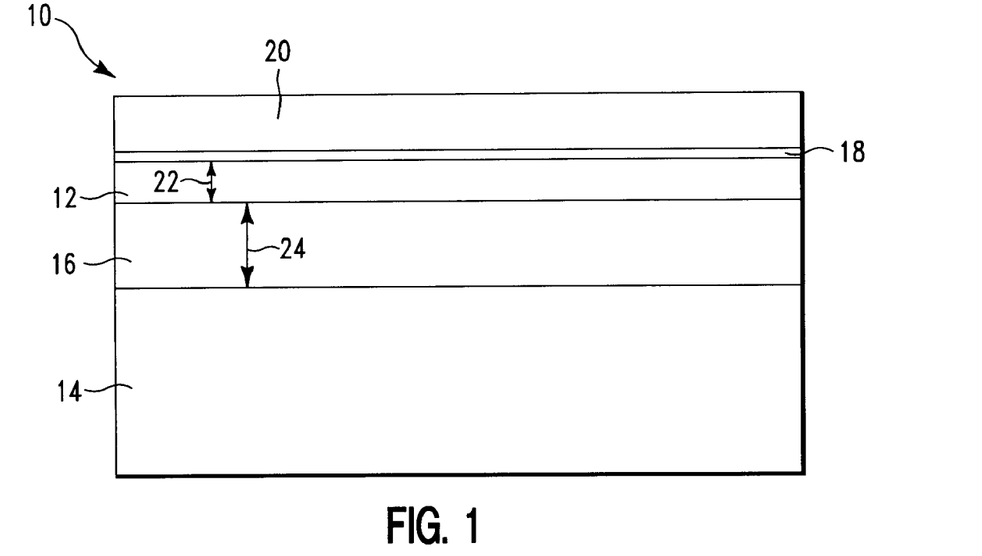
FIGS. 1 through 19 are sectional views illustrating stages in a method according to an embodiment of the invention in which a substrate is fabricated to have an SOI layer and an epitaxial layer exposed at a major surface of the substrate, the SOI layer and the epitaxial layer having two different crystal orientations.
Figure 2:
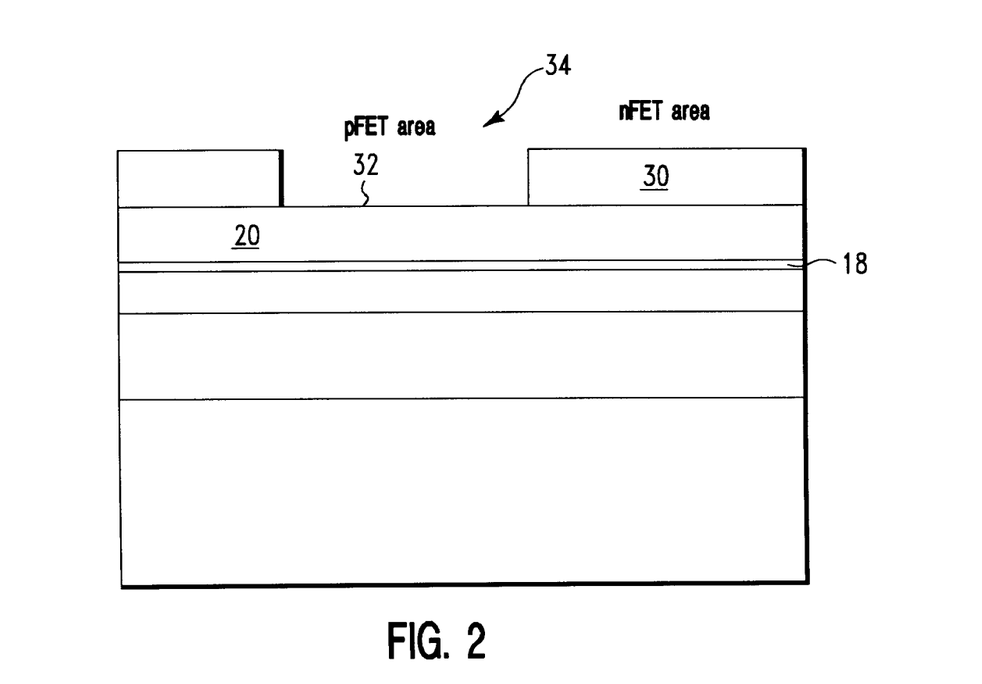

As illustrated in FIG. 1, an SOI substrate 10 is provided in which an SOI layer 12, being a single-crystal semiconductor layer having a crystal orientation of <100>, overlies a bulk single-crystal semiconductor region 14 of the substrate, the bulk region having a crystal orientation of <110>. Preferably, the bulk semiconductor region 14 and the single-crystal SOI layer 12 each consist essentially of silicon. The SOI layer is separated from the bulk region of the substrate by a buried dielectric layer, also referred to as a "buried oxide" layer 16 or "BOX" layer. Preferably, the bulk semiconductor region and the SOI layer include or consist essentially of silicon. As further shown in FIG. 1, a relatively thin pad oxide layer 18 and a pad nitride layer 20 overlie the SOI layer 12.

The SOI substrate 10 is fabricated preferably through a bonding process. In such bonding process, a handle wafer is provided which includes the bulk semiconductor region 14 having the <110> crystal orientation exposed at a major surface. The handle wafer is bonded to an initially somewhat thick bond wafer that includes a relatively thick oxide layer at a major surface of the bond wafer. The SOI layer, having the <100> crystal orientation, is present in the bond wafer on the opposite side of the oxide layer. After the handle wafer and bond wafer are bonded together, most of the bond wafer is removed, such as through grinding, or alternatively cleaving so as to leave only the relatively thin SOI layer 12 in place over the oxide layer, which now serves as the BOX layer 14. In the completed SOI substrate, an illustrative thickness 22 for the SOI layer in one embodiment is about 550 angstroms (Å). In another example, a thickness of about 700 angstroms (Å) is used. An illustrative thickness 24 for the BOX layer is 1350 angstroms.

Figure 3:
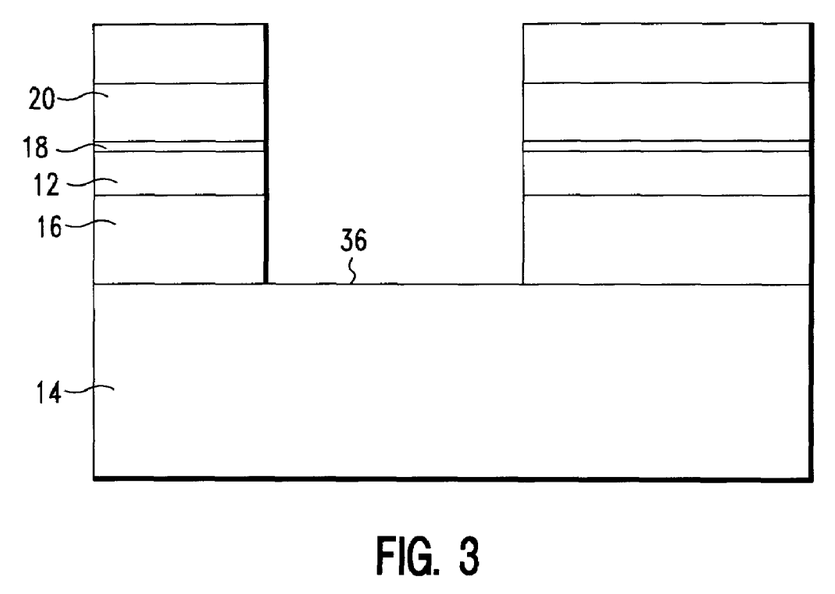

Subsequently, steps are employed to begin forming separate semiconductor regions having different crystal orientations at the surface of the substrate 10. Accordingly, in the stage of fabrication shown in FIG. 2, a layer of photoresist 30 is blanket deposited over the substrate and is then patterned to form an opening 34 exposing a portion of the major surface 32 of the pad nitride layer 20. The opening 34 preferably overlies a "PFET area" of the substrate where a p-type field effect transistor ("PFET") later will be fabricated. The layer of resist 30 covers the pad nitride layer 20 in an "nFET area" where an n-type field effect transistor ("NFET") later will be fabricated. Thereafter, as illustrated in FIG. 3, the pad nitride layer within the opening 34 and a portion of the substrate aligned with the opening are etched through the pad nitride 20, pad oxide 18, the SOI layer 12 and the BOX layer 16, in turn, until a major surface 36 of the bulk semiconductor region 14 becomes exposed.

Figure 4:
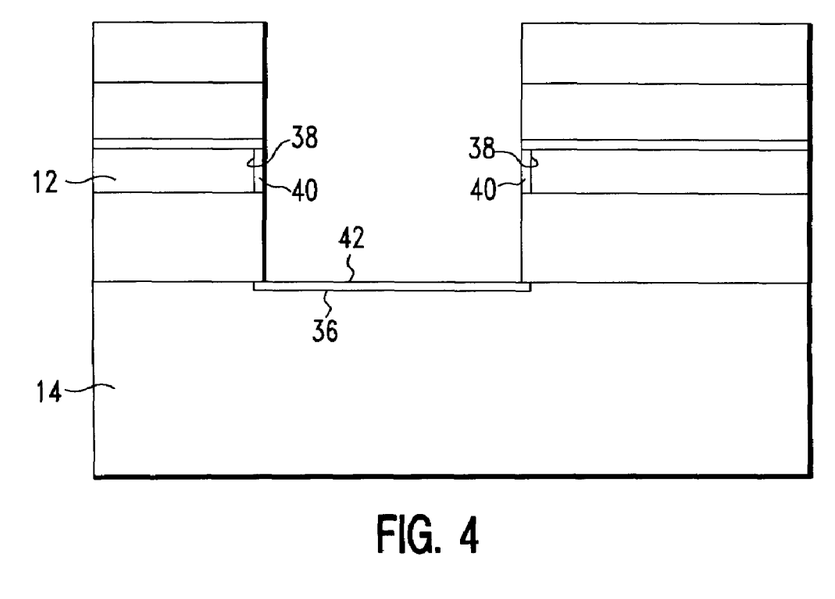

Next, as illustrated in FIG. 4, the etched substrate is subjected to a relatively brief oxidation process, by which exposed walls 38 of the SOI layer 12 are oxidized by local oxidation of silicon to form a layer of oxide 40 which is self-aligned to the walls 38. For example, to form the oxide layer, the substrate can be heated in a chamber in an ambient including a source of oxygen such as water vapor and/or molecular or atomic oxygen. During this oxidation process, a layer 42 of oxide also forms at the exposed surface 36 of the bulk region 14.

Figure 5:
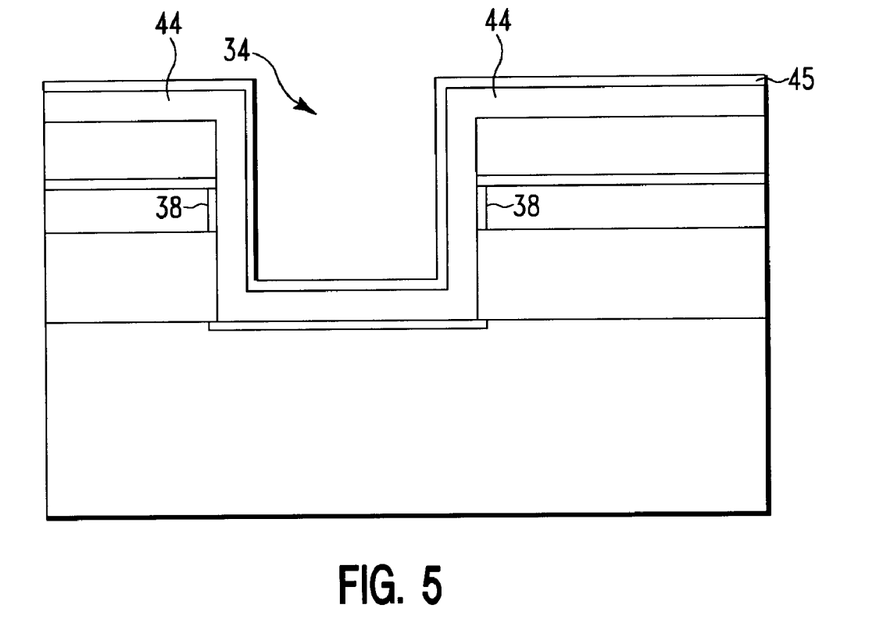

As illustrated in FIG. 5, the patterned photoresist layer is then removed from the substrate, and a dielectric layer 44 is deposited to cover the pad nitride layer 20 and the portion of the substrate within the previously formed opening 34, thus lining the walls 38 of the opening 34. The dielectric layer 44 preferably consists essentially of silicon nitride. Preferably, the thickness of the dielectric layer over the bulk region of the substrate is about 800 angstroms. When the dielectric layer consists essentially of silicon nitride, preferably a layer 45 including an oxide, especially an oxide of silicon, is formed to overlie the silicon nitride layer. This oxide layer preferably consists essentially of an oxide of silicon and preferably has substantially less thickness than the dielectric layer. Preferably, the thickness of the oxide layer is from about 1 nm to about 2 nm.

Figure 6:
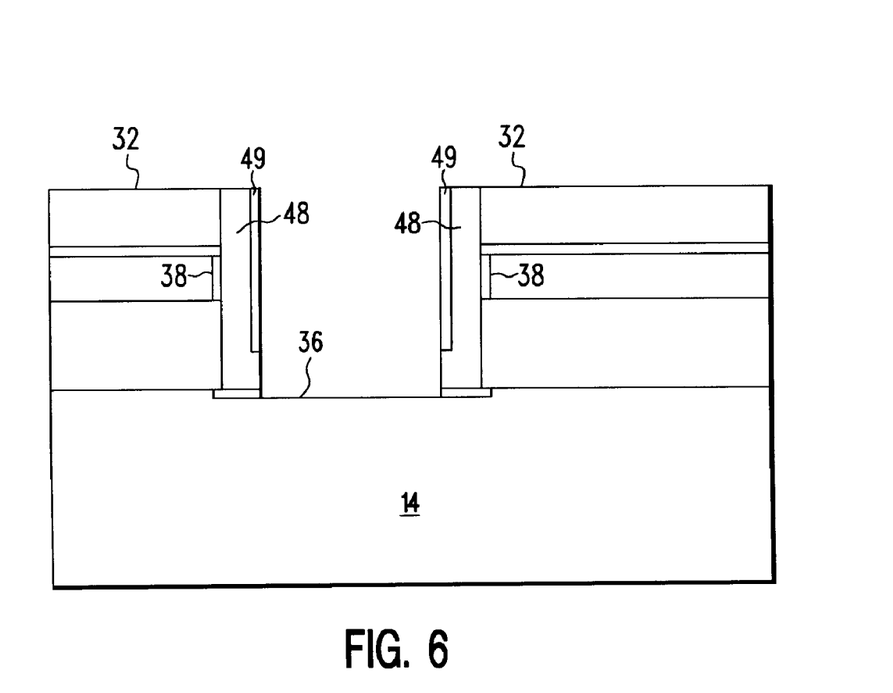

Next, as seen in FIG. 6, an anisotropic vertical etch process is employed to remove portions of the oxide layer and dielectric layer overlying the major surface 32 of the pad nitride layer and the surface 36 of the bulk region 14 to form first spacers 48 and second (oxide) spacers 49. After performing this etch process, the major surface 36 of the bulk semiconductor region is exposed. The oxide spacers 49 and nitride spacers 48 remain in place overlying the walls 38 of the SOI layer 12. When an epitaxial layer of silicon grows adjacent to a wall of other material, less stacking faults result when an oxide, especially an oxide of silicon, is exposed at a surface of such wall than when another material such as a nitride is present.

Figure 7:
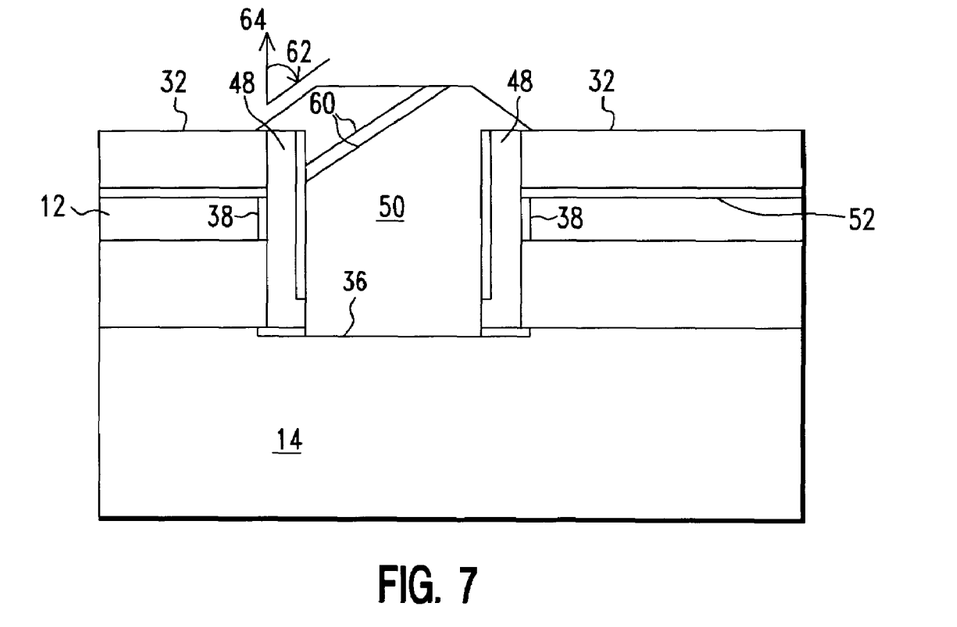

As illustrated in FIG. 7, an epitaxial single-crystal semiconductor layer 50 is now grown from the bulk semiconductor region 14, the epitaxial layer 50 having the same crystal orientation (<110>) as the bulk semiconductor region 14. Preferably, the epitaxial layer 50 is grown until it protrudes above the major surface 52 of the SOI layer and above the major surface 32 of the pad nitride layer. As the bulk semiconductor region 14 and the SOI layer 12 preferably both consist essentially of silicon, in such a case, the epitaxial layer 50 preferably consists essentially of silicon.

During the process of growing the epitaxial layer, stacking faults 60 may occur in the structure of the semiconductor crystal structure, as described above in the background to the invention. One type of stacking faults 60 can occur which are oriented at an angle 62 relative to a normal 64 to the major surface 36 of the bulk semiconductor region. Such stacking faults, which can occur at various locations throughout the epitaxial layer 50, are substantially reduced, if not eliminated, by subjecting the substrate to high temperature annealing in an ambient which includes hydrogen.

Preferably, the high temperature anneal is performed after growing the epitaxial layer but prior to a subsequent step which alters the shape, thickness or contour of the epitaxial layer. Preferably, the high temperature anneal is performed prior to a subsequent step of chemical mechanical polishing described below with reference to FIG. 8. To perform the anneal, in an exemplary embodiment, molecular hydrogen ($H_2$) is supplied to a chamber in which the substrate is present and the temperature is gradually raised to a target temperature for performing the anneal. When the substrate consists essentially of silicon, the annealing step is performed at a nominal temperature of between about 1100 and 1300 degrees Celsius, preferably at about 1200 degrees Celsius, for a duration of between about 30 seconds and 300 seconds, or nominally about 120 seconds. During the annealing step, the pressure within the chamber is preferably between about 20 torr and about 760 torr. Preferably, no other gases are present in the chamber. The hydrogen should be very pure. At the temperatures at which the anneal is performed, the hydrogen is assumed to be dissociated. The temperature of the substrate should be raised no higher than about 1300 degrees Celsius in order to avoid melting of the silicon.

During the annealing step, the high temperature and hydrogen ambient promote the movement of silicon atoms such that atoms become rearranged at locations of the stacking faults into a more orderly crystal structure. In this way, the silicon atoms become rearranged into a crystal structure in which the stacking faults are substantially reduced or eliminated.

Figure 8:
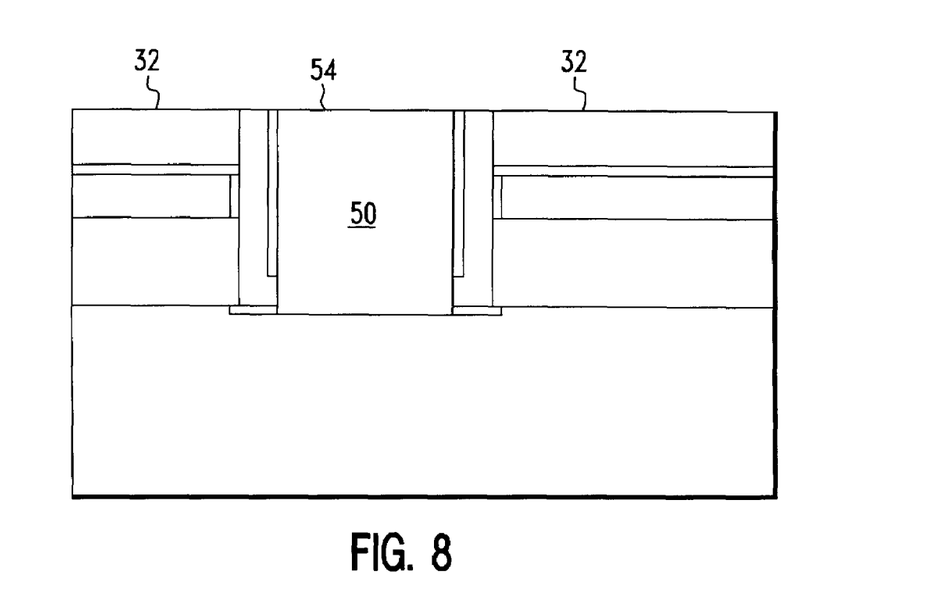

Subsequently, as illustrated in FIG. 8, a major surface 54 of the epitaxial layer 50 is planarized to the major surface 32 of the pad nitride layer, such as through a process known as chemical mechanical polishing. Alternatively, one or more other planarization techniques can be used such as an etch back process for planarizing the upper surface of the epitaxial layer to the major surface 32 of the pad nitride.

Subsequently, as further illustrated in FIG. 9, a sacrificial oxide layer 56 is formed to overlie the epitaxial layer 50. Preferably, this oxide layer 56 is formed by local oxidation of silicon, such as by a process described above with reference to FIG. 4. During this oxidation step, an upper portion of the epitaxial layer 50 is converted to oxide such that the top surface 58 of the epitaxial layer 50 in contact with the sacrificial oxide layer 56 is about even with the height 22 of the pad oxide 18 above the interface between the SOI layer 12 and the BOX layer 16. During the local oxidation process, the pad nitride 20 and the spacers 48, 49 protect the SOI layer 12 from being converted to oxide.

Figure 10:
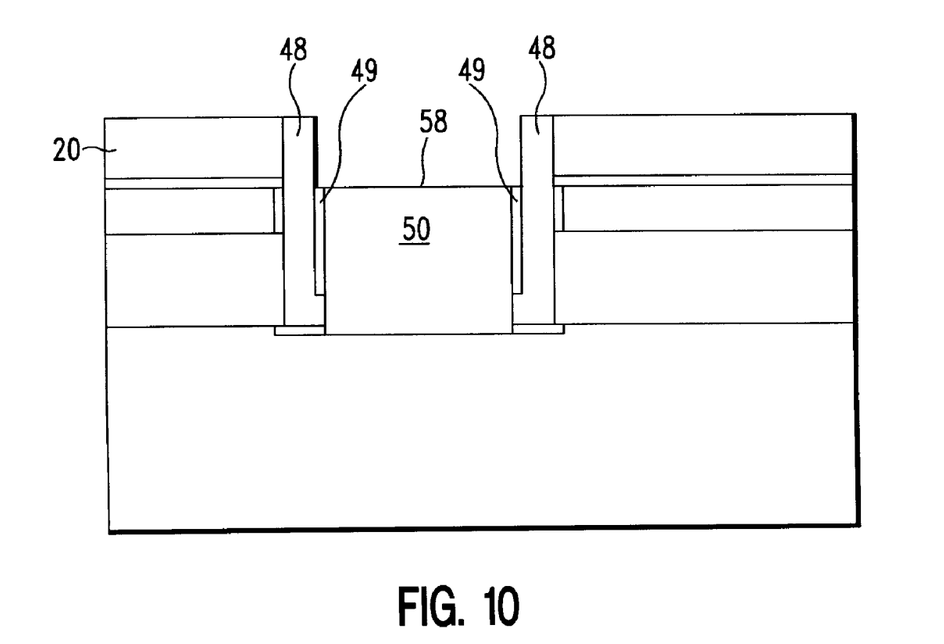

In a subsequent stage of processing illustrated in FIG. 10, the sacrificial oxide layer is removed, such as by chemical etching in a manner which preferably is selective to the nitride material of the pad layer 20 and that of the spacer 48. During this process, portions of the oxide spacers 49 exposed above the top surface 58 of the epitaxial layer 50 may be removed.

Figure 11:
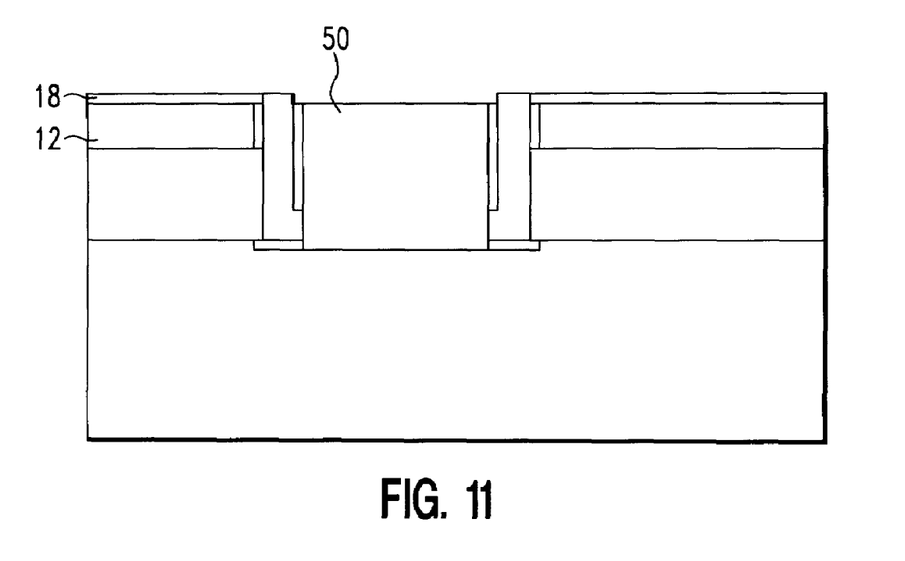

Then, as illustrated in FIG. 11, the pad nitride layer is removed, preferably by chemical etching selective to silicon and to oxide. Through this step of etching, surfaces of the pad oxide and the epitaxial layer 50 become exposed. Thereafter, the pad oxide 18 is removed, such as by further chemical etching with an etchant that attacks oxide. The pad oxide preferably is etched by a process which preserves silicon so as to preserve the underlying SOI layer 12 and the exposed epitaxial layer 50 from being attacked.

Figure 12:
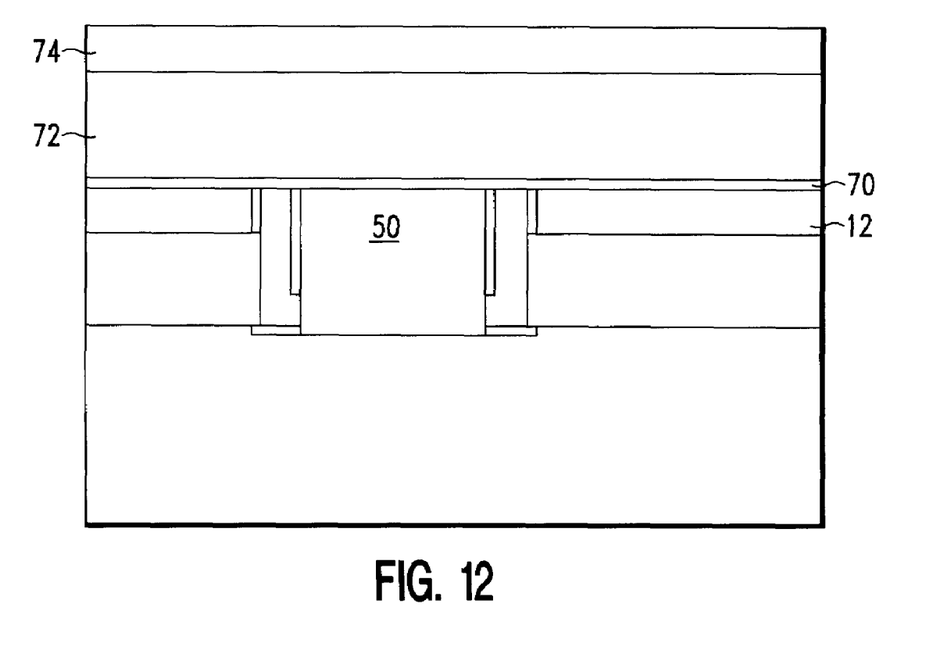
Figure 15:
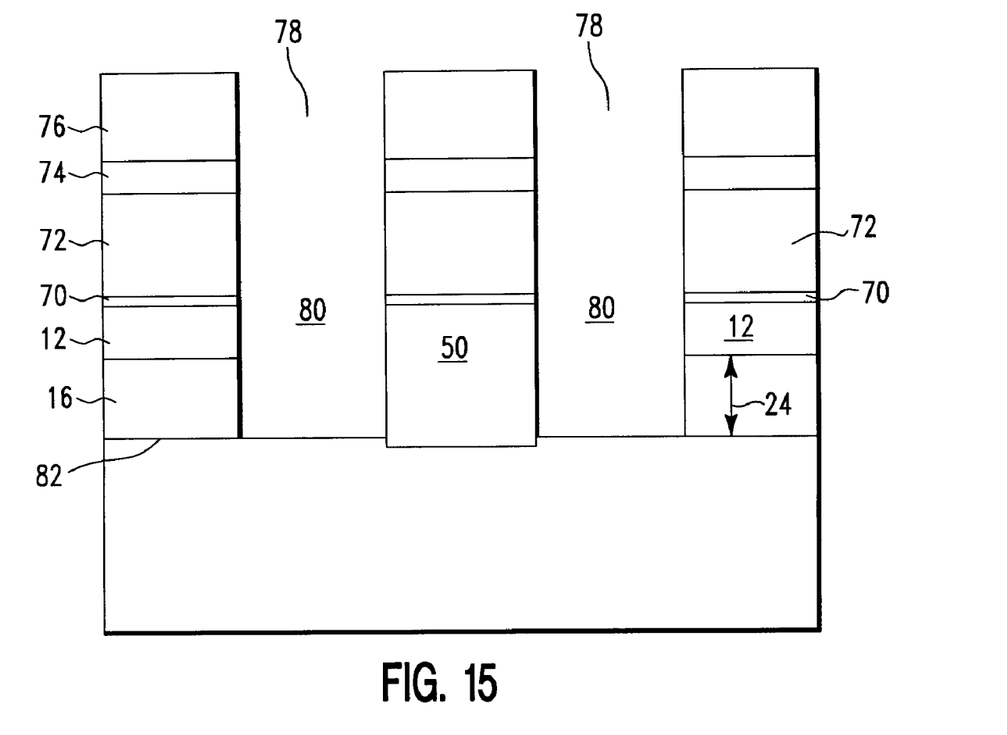

In a further stage of processing illustrated in FIG. 12, a new pad oxide layer 70 is formed overlying the SOI layer 12 and the epitaxial layer 50, the pad oxide layer preferably being formed by local oxidation of silicon. Thereafter, a new pad nitride layer 72 is deposited to cover the structure, preferably to a thickness of about 800 angstroms (Å). Optionally, an additional hard mask layer 74, such as may include an oxide such as borosilicate glass for example, among other possible materials, can be deposited at this time. Such hard mask is formed as an additional layer covering the pad nitride for use during a subsequent etching step as described below (FIG. 15). When a hard mask layer is present, it is usually possible to etch more deeply into the substrate and to achieve smaller line widths in the etched features.

Figure 13:
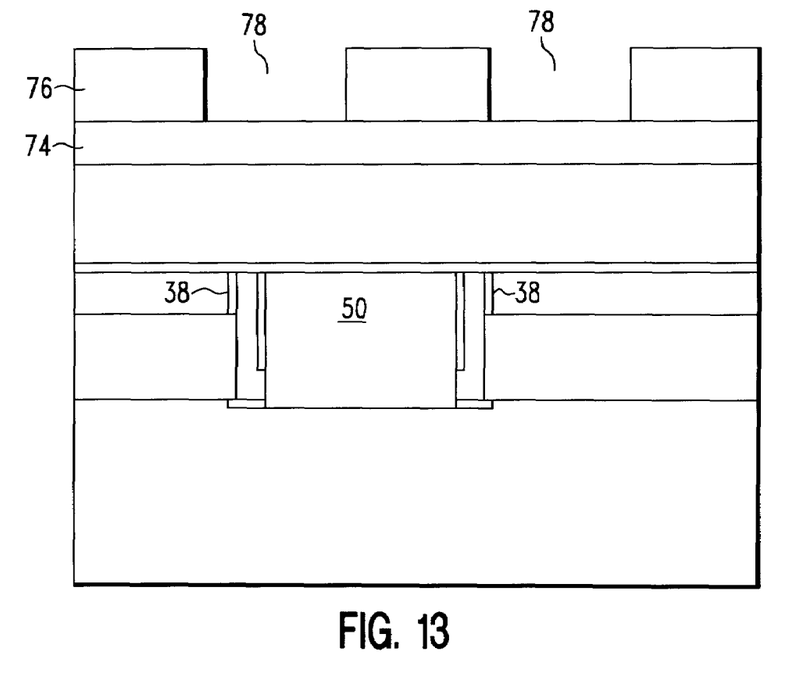
Figure 14:
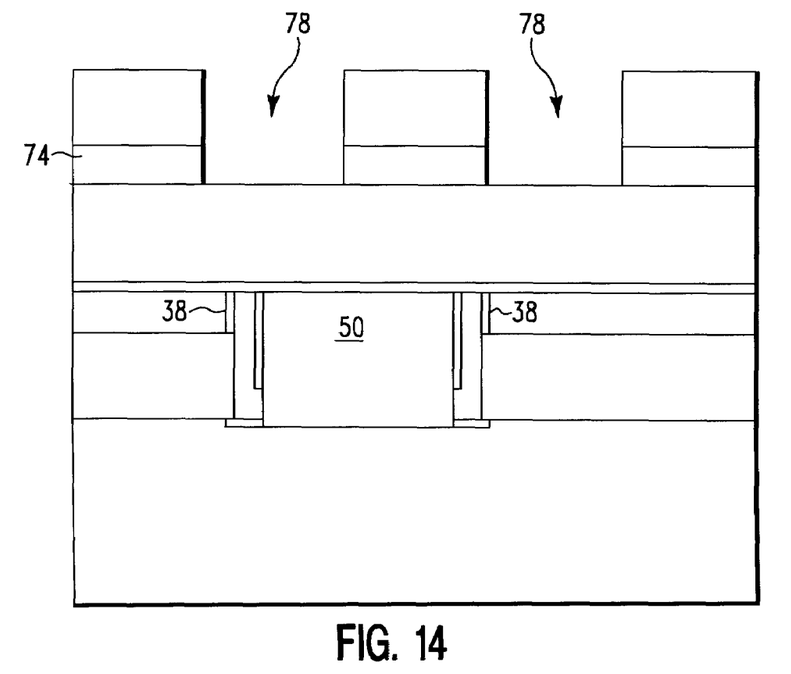

With reference to FIG. 13, thereafter, a photoresist layer 76 is deposited to overlie the hard mask layer 74. Subsequently, the resist layer 76 is patterned by photolithography to expose portions of the hard mask layer 74. Then, the hard mask layer 74 is patterned to form corresponding openings 78 (FIG. 14) therein which overlie the walls 38 of the SOI layer and adjacent portions of the epitaxial layer 50.

Next, as illustrated in FIG. 15, an anisotropic vertical etch process, such as a reactive ion etch ("RIE") is employed to etch trenches 80 in the pad nitride 72, the underlying pad oxide 70, the SOI layer 12 and the epitaxial layer 50, the trenches being aligned with the openings 78 in the hard mask and resist 76. Preferably, this etch process is performed until the depth of the trenches 80 reaches or exceeds a bottom edge 82 of the BOX layer 16. However, in a particular embodiment of the invention, the trenches 80 can be etched not as deeply, for example, to a depth of about halfway through the thickness 24 of the BOX layer 16 or greater.

Figure 16:
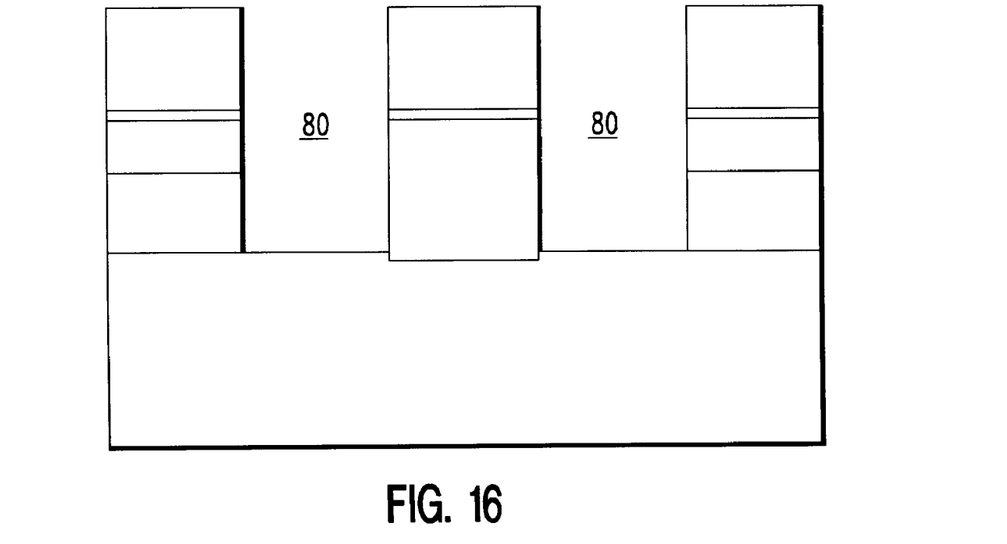

As illustrated in FIG. 16, any photoresist and hard mask material which remains after etching the trenches 80 is now stripped from the substrate, using processes which are selective to the pad nitride, silicon and silicon dioxide materials of the pad nitride layer, SOI layer, epitaxial layer and the BOX layer that remain, respectively.

Figure 17:
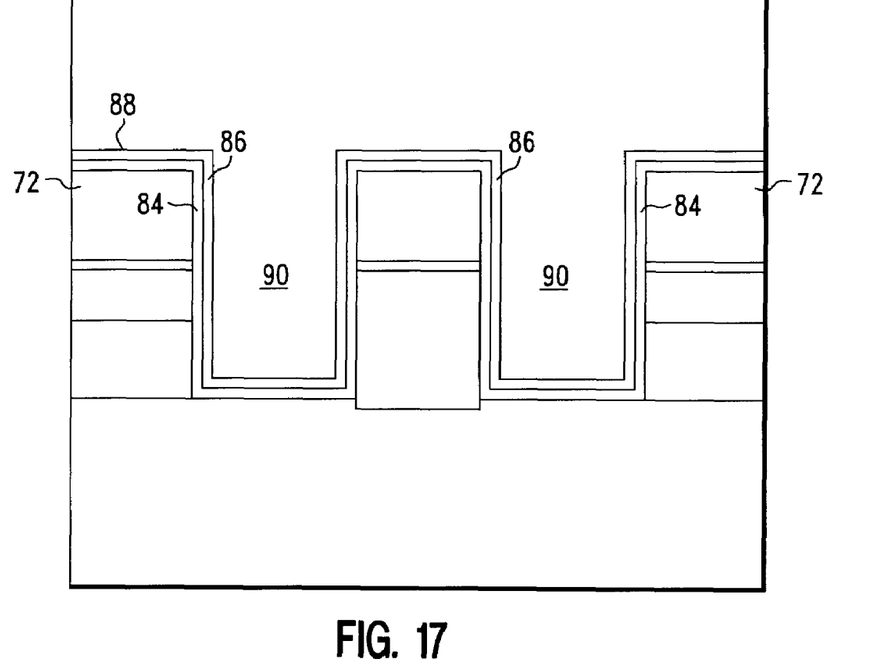

Next, as illustrated in FIG. 17, materials are deposited within the trenches 80 to begin to form trench isolation regions. Preferably, a process is used in which initially a thin layer 84 including a nitride such as silicon nitride or, alternatively, silicon oxynitride having a thickness of between about 10 angstroms and 50 angstroms, nominally 24 angstroms, is deposited as a liner within the trenches. Thereafter, a somewhat thicker liner 86, preferably including or consisting essentially of silicon oxide, is deposited by a high temperature process. The liner 86 preferably has a thickness between about 100 angstroms and about 300 angstroms, and more preferably about 200 angstroms. After the liners have been formed, a plasma vapor deposition process is used to deposit an oxide fill material 90 within the trenches, such as by using a high density plasma ("HDP") deposition. Preferably, the oxide fill material 90 is deposited to a thickness of about 3700 angstroms, as measured from the upper surface 88 of the liner 86 above the pad nitride layer 72.

Figure 18:
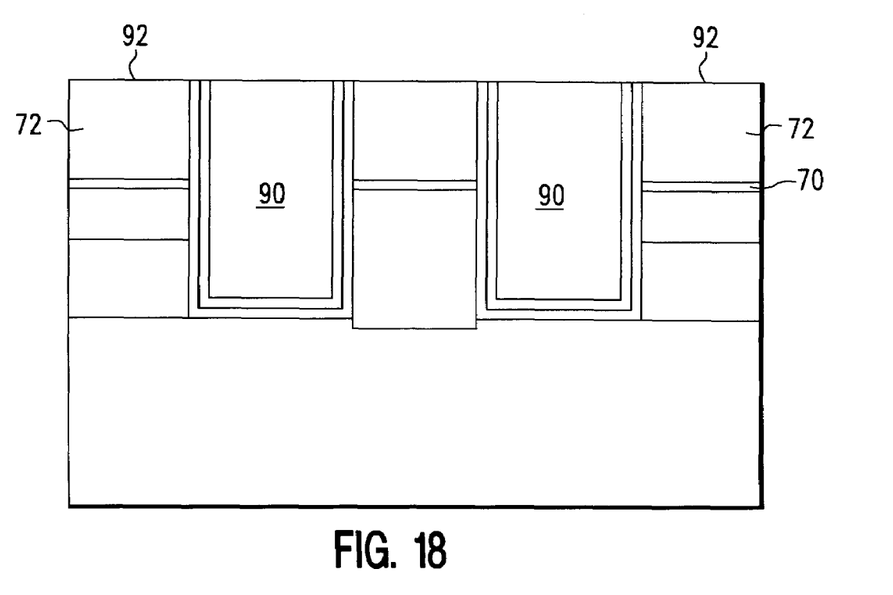
Figure 19:
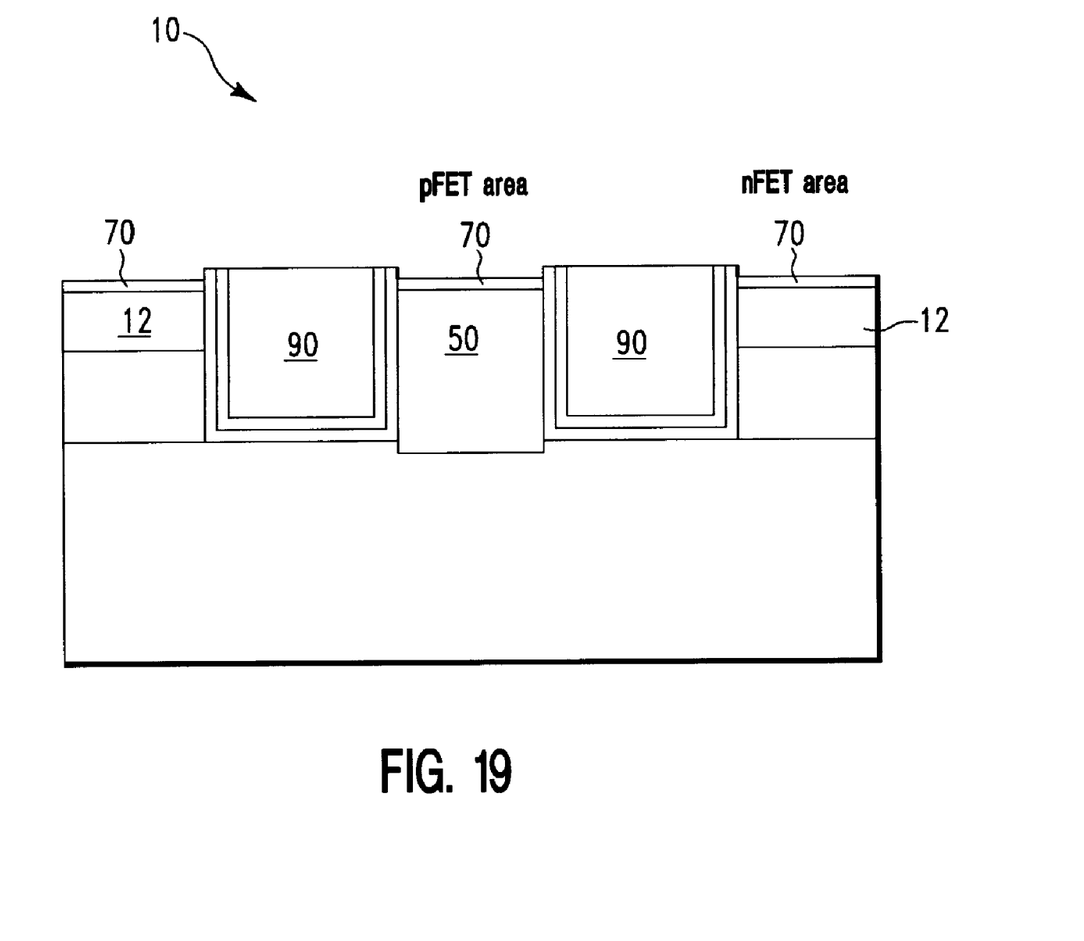

Subsequently, as illustrated in FIG. 18, the oxide fill 90 is planarized to the major surface 92 of the pad nitride layer 72, for example, by chemical mechanical polishing ("CMP"). In a particular embodiment, the CMP step can be performed in a manner which is selective to silicon nitride so as to preserve the pad nitride layer 72. Alternatively, the CMP step can be endpointed on the pad nitride layer, e.g., by detecting a chemical released upon reaching the pad nitride layer. Thereafter, as illustrated in FIG. 19, in a further step, the pad nitride layer is removed, as by chemical etching selective to oxide, thereby preserving the pad oxide 70. After removal of the pad nitride, the oxide fill 90 is preserved in trench isolation regions, the trench isolations being disposed between the epitaxial silicon layer 50 and portions of the SOI layer 12 adjacent to the epitaxial layer 50.

After this stage of processing, the substrate 10 has now been prepared for further processing to form transistors including a PFET and an NFET. During such subsequent processing, a PFET can be fabricated in the PFET area from the epitaxial layer 50 that has a crystal orientation of <110>, the PFET having a source-drain conduction path disposed in the epitaxial layer. On the other hand, an NFET can be fabricated in the nFET area from the SOI layer that has a crystal orientation of <100>, the nFET having a source-drain conduction path disposed in the SOI layer 12. Through further processing, the two transistors PFET and NFET can be electrically connected together to form circuits, such as complementary metal oxide semiconductor ("CMOS") circuits, for example.

Figure 9:
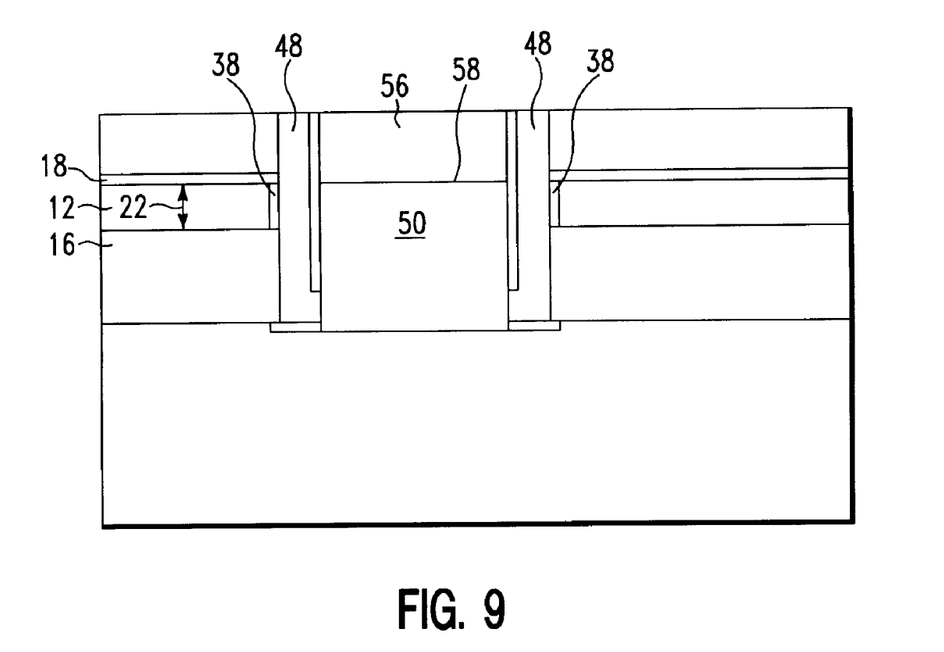

In a variation of the embodiment described above, high temperature annealing is performed after the epitaxial layer 50 (FIG. 8) is planarized to produce an outer surface 54 which is at least substantially co-planar with the pad nitride layer 32, but prior to forming the sacrificial oxide layer 56 (FIG. 9). In such case, the temperature at which the anneal is performed and pressure of the molecular hydrogen present in the chamber may vary from that used in the above-described embodiment.

In yet another variation of the above-described embodiment, high temperature annealing is performed after the sacrificial oxide 56 (FIG. 9) is removed, i.e., after the stage of processing shown in FIG. 10. Again, in such case, the temperature and pressure of the molecular hydrogen present in the chamber may vary from that used in the above-described embodiment or the variation thereof.

In a particular variation of the above-described embodiment, the spacer 48 consists essentially of an oxide, especially an oxide of silicon. More preferably, the spacer consists essentially of silicon dioxide. In such case, the additional spacer 49 need not be formed because spacer 48 has an oxide exposed at its surface. As mentioned above, fewer stacking faults result when an epitaxial silicon layer is grown along a surface including an oxide, e.g., silicon dioxide, among other possible materials, than when such surface includes a different material such as a nitride. During removal of the sacrificial oxide 56 (FIG. 9), such oxide spacer may become eroded, such that it is possible that the etchant erodes portions of the wall of the SOI layer 12 adjacent to the epitaxial layer. However, such erosion is not detrimental to the subsequently formed transistor structures described with reference to FIG. 19 because the eroded portions of the SOI layer 12 adjacent to walls 38 are removed during a later step when the trenches 80 (FIG. 15) are etched in the SOI layer and BOX layer.

The foregoing example of forming a semiconductor substrate having epitaxial and SOI layers with different crystal orientations is but one example of a use of the invention in reducing stacking faults within an epitaxial layer of silicon by high temperature annealing. The invention can also be used in other contexts, as well, such as during the fabrication of bipolar transistors and other devices in which an epitaxial layer having a <110> crystal orientation is grown on a pre-existing semiconductor region. It is intended by the claims appended below to cover all such variations and embodiments of the invention.

While the invention has been described in accordance with certain preferred embodiments thereof, many modifications and enhancements can be made thereto without departing from the true scope and spirit of the invention, which is limited only by the claims appended below.

What is claimed is:

1. A method of reducing stacking faults in an epitaxial semiconductor layer, comprising:
   providing a substrate including a first single-crystal semiconductor region including a first semiconductor material, the first single-crystal semiconductor region having a <110> crystal orientation;
   growing an epitaxial layer including the first semiconductor material on the first semiconductor region, the epitaxial layer having the <110> crystal orientation; and
   annealing the substrate with the epitaxial layer in an ambient including hydrogen at a temperature greater than 1100 degrees Celsius, whereby the step of annealing reduces stacking faults in the epitaxial layer.

2. The method as claimed in claim 1, wherein the step of annealing is performed at a temperature of about 1200 degrees Celsius.

3. The method as claimed in claim 1, wherein the step of annealing is performed at a temperature below 1300 degrees Celsius.

4. A method of reducing stacking faults in an epitaxial semiconductor layer of a substrate, comprising:
   providing a semiconductor-on-insulator substrate including a bulk semiconductor region including a first semiconductor material having a first crystal orientation being a <110> crystal orientation, a semiconductor-on-insulator ("SOI") layer having a second crystal orientation different from the <110> crystal orientation and a buried dielectric layer disposed between the bulk semiconductor region and the SOI layer;
   forming an opening in the SOI layer and the buried dielectric layer, the opening exposing the bulk semiconductor region below the buried dielectric layer;
   growing an epitaxial layer including the first semiconductor material on the bulk semiconductor region, the epitaxial layer having the <110> crystal orientation; and
   annealing the substrate with the epitaxial layer in an ambient including hydrogen at a temperature greater than 1100 degrees Celsius, whereby the step of annealing reduces stacking faults in the epitaxial layer.

5. The method as claimed in claim 4, further comprising forming a first spacer overlying a wall of the opening prior to the step of growing the epitaxial layer, the spacer including a nitride.

6. The method as claimed in claim 4, further comprising forming a) a first spacer overlying a wall of the opening and b) a second spacer overlying the first spacer prior to the step of growing the epitaxial layer, the first spacer including a nitride and the second spacer including an oxide.

7. The method as claimed in claim 4, wherein the second crystal orientation of the SOI layer is <100>.

8. The method as claimed in claim 7, further comprising fabricating an n-type field effect transistor ("NFET") having a source-drain conduction path in the SOI layer and fabricating a p-type field effect transistor ("PFET") having a source-drain conduction path in the epitaxial layer.

9. The method as claimed in claim 7, further comprising lining a wall of the opening with silicon nitride prior to growing the epitaxial layer.

10. The method as claimed in claim 7, wherein the step of annealing is performed at a temperature of about 1200 degrees Celsius.

11. The method as claimed in claim 7, wherein the step of annealing is performed at a temperature below 1300 degrees Celsius.

* * * * *